(12) United States Patent
Zare-Hoseini

(10) Patent No.: US 8,410,846 B2
(45) Date of Patent: Apr. 2, 2013

(54) VARIABLE GAIN AMPLIFIER

(75) Inventor: Hashem Zare-Hoseini, Cambridge (GB)

(73) Assignee: Cambridge Silicon Radio Limited, Cambridge, Cambridgeshire (GB)

( * ) Notice: Subject to any disclaimer, the term of this patent is extended or adjusted under 35 U.S.C. 154(b) by 76 days.

(21) Appl. No.: 13/126,222

(22) PCT Filed: Sep. 11, 2009

(86) PCT No.: PCT/GB2009/051177
§ 371 (c)(1),
(2), (4) Date: Jul. 12, 2011

(87) PCT Pub. No.: WO2010/049713
PCT Pub. Date: May 6, 2010

(65) Prior Publication Data
US 2011/0260901 A1    Oct. 27, 2011

(30) Foreign Application Priority Data
Oct. 31, 2008   (GB) .................................. 0820041.2

(51) Int. Cl.
*H03F 1/14* (2006.01)
(52) U.S. Cl. ............ 330/51; 330/86; 330/107; 330/151; 330/254; 330/294; 327/337; 327/560; 327/561
(58) Field of Classification Search .................... 330/51, 330/86, 107, 151, 254, 294; 327/337, 560, 327/561
See application file for complete search history.

(56) References Cited

U.S. PATENT DOCUMENTS

| | | | | |
|---|---|---|---|---|
| 5,708,376 | A | * | 1/1998 | Ikeda ............................... 327/50 |
| 7,342,442 | B2 | * | 3/2008 | Nakatani et al. ................ 330/51 |
| 2005/0264360 | A1 | | 12/2005 | Ma et al. |
| 2006/0176112 | A1 | * | 8/2006 | Nakatani et al. ................ 330/51 |
| 2012/0249235 | A1 | * | 10/2012 | Zare-Hoseini et al. ......... 330/86 |

FOREIGN PATENT DOCUMENTS

JP          62003519          1/1987

OTHER PUBLICATIONS

International Search Report in PCT/GB2009/051177 dated Apr. 12, 2009, 3 pages.

* cited by examiner

*Primary Examiner* — Lam T Mai
(74) *Attorney, Agent, or Firm* — Mark J. Danielson; Pillsbury Winthrop Shaw Pittman LLP

(57) ABSTRACT

A variable gain amplifier includes an integrator having an input, an output and a feedback loop connected between the input and output, a plurality of input chains connected in parallel between the amplifier input and the input of the integrator, each input chain including a resistor and a first switch and a plurality of second switches, each second switch connected between an intermediate node between the resistor and first switch of a respective input chain and the feedback loop of the integrator, wherein the resistance of the resistors in the input chains is scaled by a scaling factor with respect to one another and the on-resistances of the first and second switches connected to each intermediate node are scaled by the corresponding scaling factor.

7 Claims, 3 Drawing Sheets

VARIABLE GAIN AMPLIFIER

BACKGROUND

1. Technical Field

It is common practice in electronic circuits to amplify or attenuate a received input signal using a variable gain amplifier so as to, for example, ensure that further circuit elements receive the maximum value of input signal to maximise the signal to noise ratio of the received signal. The provision of a variable gain amplifier to receive a variable amplitude input signal prior to further processing of the amplified input signal by other circuit elements is typical in audio and radio frequency receivers.

2. Related Technology

In such electronic circuits the gain of the variable in amplifier is set by using a number of switches to select one or more input resistors to set the required gain. The switches are implemented as transistors. Depending on the input signal to the variable gain amplifier, the resistance of the transistors used to implement the switches can vary as a function of the input signal, this variation in resistance of the transistor having an effect on the overall gain of the amplifier. As the input signal is typically a non-constant amplitude signal, the resistance of the transistors can vary as the input signal varies and therefore the performance of the variable gain amplifier can vary. This non-linear behaviour of the variable in amplifier in certain circumstances is particularly undesirable when very high quality performance is required, since the non-linear effects of the transistor switches can become dominant and lead to harmonic distortions on the output signal. It would therefore be advantageous to provide a variable gain amplifier stage in which the effect of the non-linearity of the transistor switches was at least reduced.

SUMMARY

According to a first aspect of the present invention there is provided a variable gain amplifier comprising an integrator having a first input, an output and a feedback loop connected between the first input and the output, a plurality of input chains connected in parallel between the amplifier input and the first input of the integrator, each input chain including a resistor and a first switch, and a plurality of second switches, each second switch connected between an intermediate node between the resistor and first switch of a respective input chain and the feedback loop of the integrator, wherein the resistance of the resistors is scaled by a scaling factor with respect to one another and the on-resistance is of the first and second switches connected to each intermediate node are scaled by the respective scaling factor.

Preferably the first and second switches comprise transistors. The on-resistances of the transistors may be scaled by scaling one or both of the width and length of the transistors, i.e. scaling the silicon area of the transistor.

The on-resistance of a first switch in an output chain may not be equal to the on-resistance of the corresponding second switch connected to the input chain. In other words, the absolute values of any pair of switches need not be equal.

The scaling factor applied to the resistor and first and second switches of a first input chain with respect to a further input chain is may not be equal to the scaling factor applied to the resistor and first and second switch of a second input chain with respect to the further input chain. In other words the scaling factor may vary for any pair of input chains as desired.

In preferred embodiments the integrator comprises an operational amplifier.

According to a further aspect of the present invention there is provided an analogue-to-digital converter including a variable gain amplifier according to the first aspect of the invention.

BRIEF DESCRIPTION OF THE DRAWINGS

Embodiments of the present invention will now be described below, by way of non-limiting example only, and with reference to the accompanying figures, of which.

DETAILED DESCRIPTION

Figure 1:
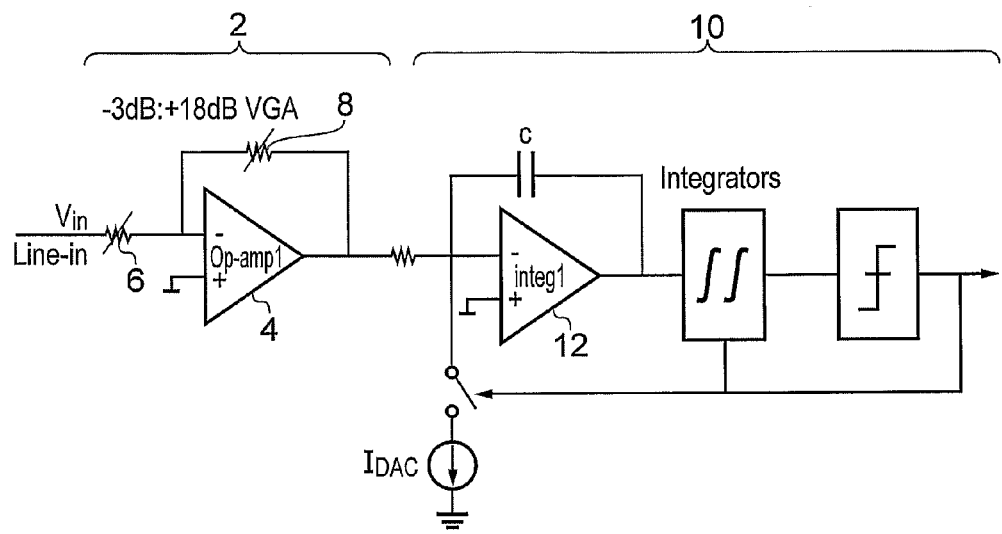
FIG. 1 shows a simplified schematic of a variable gain amplifier followed by an analogue to digital converter (ADC)

FIG. 1 shows a simplified schematic of a variable gain amplifier according to the known prior art in combination with part of a radio receiver. The variable gain amplifier 2 comprises an operational amplifier 4 with a first variable resistor 6 connected between the inverting input of the operational amplifier 4 and an audio input $V_{in}$ and a second variable resistor 8 connected between the output of the operational amplifier 4 and the inverting input. The output of the variable gain amplifier 2 is connected to the input of a Delta-Sigma analogue to digital converter core 10. The detailed construction of the analogue to digital converter 10 is not of relevance to embodiments of the present invention, except suffice to say that the ADC 10 includes at least one integrator 12, implemented as a further operational amplifier.

Figure 2:
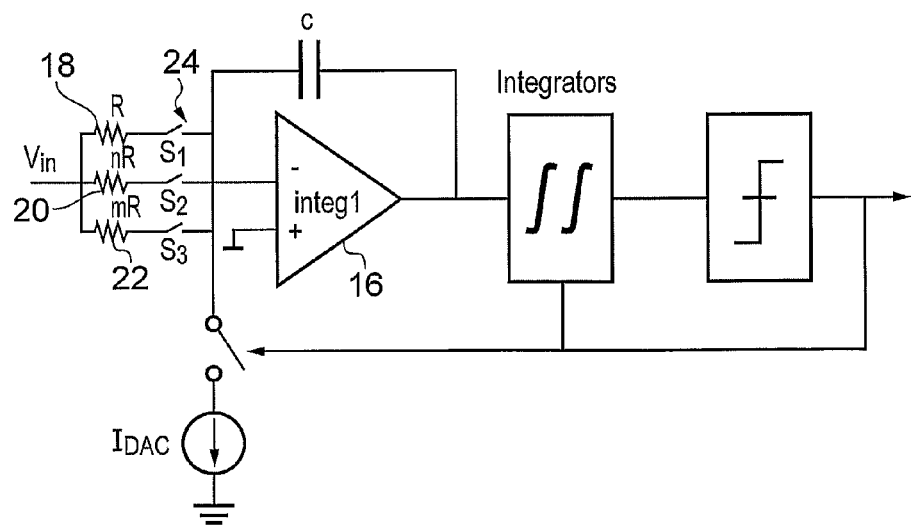
FIG. 2 shows a modification of the circuit shown in FIG. 1 in which the amplifier has been incorporated within the ADC.

Accepted good practice in the prior art for low power systems such as that shown in FIG. 1 is to move the variable gain stage into the analogue to digital converter section. The resulting circuit is schematically shown in FIG. 2, in which the operational amplifier 4 of the variable in stage shown in FIG. 1 and the integrator 12 have been replaced by a single operational amplifier integrator 16. As the gain stage is now inside the feedback system of the analogue to digital converter, the performance requirement of the gain stage is relaxed and the power consumption is reduced in comparison to the circuit shown in FIG. 1. Also illustrated in FIG. 2 is a typical implementation of the variable resistor 6 shown in FIG. 1 connected between the input voltage $V_{in}$ and the inverting input of the operational amplifier 4, 16. In this typical implementation a number of parallel "input chains" are provided connected between the input voltage $V_{in}$ and the inverting input of the op-amp integrator 16. Each input chain includes a resistor and a switch, the switch typically being implemented as a transistor. The values of the resistors in the input chains are different to one another and therefore by connecting one or more of the input chains to the inverting input of the operational amplifier integrator by closing the corresponding switch or switches the input resistor between the input voltage node and the inverting input of the op-amp integrator can be varied. Typically, but not necessarily, the values of the resistors vary by integer scaling factors. For example, in the particular arrangement shown in FIG. 2, in a first one of the input chains the resistor 18 has a resistance R, the second resistor 20 in the next input chain has a resistance of nR, where n is a first scaling factor and is most typically an integer value, whilst the third resistor 22 in the third input chain has a resistance of mR, where m is a second scaling factor that may or may not be equal to n.

As previously discussed, any variations in the on-resistance of the switches 24, such as for example those arising from any non-linearity's in the transistor switches 24, will have an effect on the performance of the gain stage. Since the gain stage is incorporated within the integrator in the circuit shown in FIG. 2, any non-linearity's within the transistor switches 24 affect the performance of the integrator and so the ADC.

Figure 3:
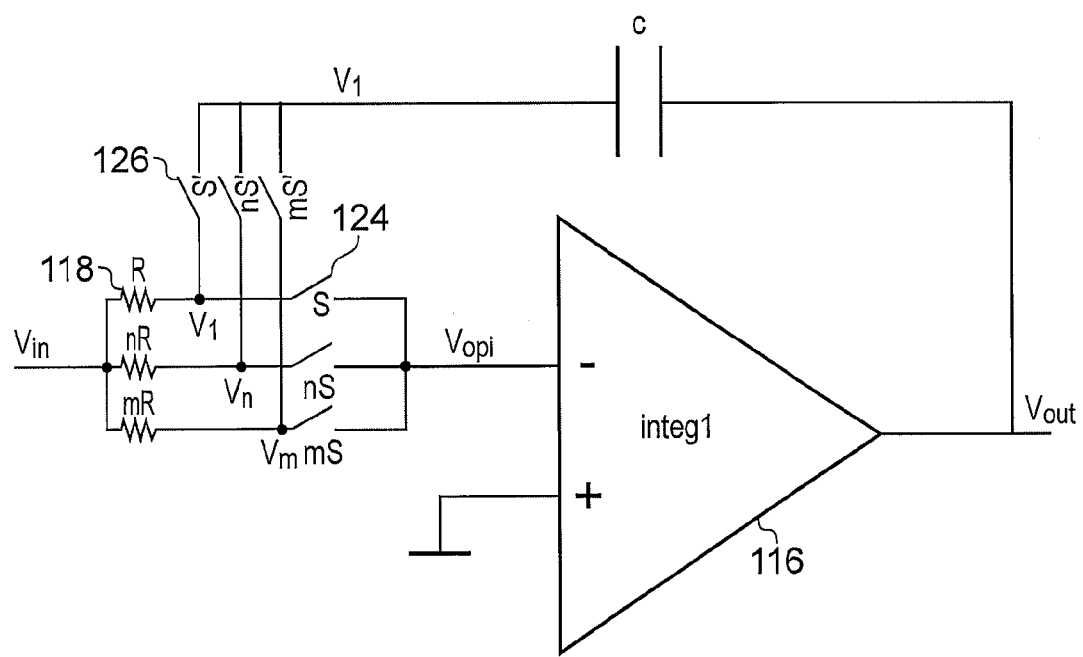
FIG. 3 shows a variable gain amplifier, in combination with an integrator, according to an embodiment of the present invention.

An embodiment of the present invention that addresses the problems with the known prior art discussed above is schematically illustrated in FIG. 3. Only the combined operational amplifier integrator 116 is shown in FIG. 3, together with the associated input chains and a feedback loop, but it will be readily appreciated that the gain stage shown in FIG. 3 can be simply substituted for the corresponding circuit elements shown in FIG. 2, for example. In FIG. 3 each input chain also includes a resistor 118 and a corresponding switch 124, with each input chain selectively collected in parallel between the input $V_{in}$ and the inverting input of the operational amplifier integrator 116. As with the input chains of the circuit shown in FIG. 2, in embodiments of the present invention the values of the resistors 118 in each input chain are scaled with respect to one another. For example, the value of the resistor 118 in the first input chain shown in FIG. 3 is R, that of the second chain nR and that of the third chain mR, with n and m being preferably integer values that may or may not be equal to one another. However, in embodiments of the present invention the on-resistances of each switch 124 in the respective input chains is also scaled between chains by the same scaling factor as the resistances. For example, the on-resistance of the switch 124 in the second input chain is n times greater than that of the switch in the first input chain (n being the scaling factor of the resistances between the first and second input chain), whilst the switch 124 in the third input chain is no times greater than that of the first input chain (with m being the scaling factor of the resistances between the first and third input chains). The on-resistance of the switches 124 may, for example, be controlled by varying the silicon area of the transistors used to implement the switches 124. In addition to the set of first switches 124 in each input chain, in embodiments of the present invention there are also provided a set of second switches 126. Each second switch s' is connected at an intermediate node of a respective input chain between the resistor 118 and first switch 124 and the feedback loop of the operational amplifier integrator 116, such that a single one of the second switches 126 is connected to an intermediate node of a corresponding input chain, with the other terminal of the second switches being connected to a common point within the feedback loop. Similarly to the first switches 124, the second switches may be implemented as transistors and their on-resistances are scaled with respect to one another, with the scaling factor being the same as that of the respective input chain. For example, the second switch 126 connected to the second input chain has an on-resistance n times that of the second switch connected to the first input chain and so on. It is to be noted that the absolute values of the on-resistances of the first and second switches may be different and it is only the scaling factors that are the same for any given input chain. For example, for the second input chain having resistance nR, the on resistance values of a first switch ns and second switch ns' may or may not be equal, but the on-resistances will be n times those of the respective switches from the first input chain having a resistor value of R. The first and second switches associated with an input chain are always selected together, such that, for example, should the first input chain be selected then both the first and second switches will be in the on position.

In operation one or more of the pairs are first and second switches will be selected so as to select the desired input resistance for the desired gain. As it is not possible to sink current into the input of an (idealised) operational amplifier, there will be no current flow through the selected first switches 124 and therefore the voltage at the intermediate node of the selected input chains will be equal to the voltage at the inverting input of the operational amplifier integrator 116. Therefore, a current inversely proportional to the input resistance is passed to the feedback loop. Since no current is passed through the selected first switches any variation in their on-resistance caused by non-linearity's within the switches has no effect on the gain of the gain stage. Furthermore, any variations in the on-resistances of the second switches 126 caused by non-linearity's in their behaviour will only result in some additive nonlinearity to the output of the operational amplifier integrator, as the second switches 126 are in the feedback loop, rather than the non-linearity's being integrated by the integrator as with the prior art.

Figure 4:
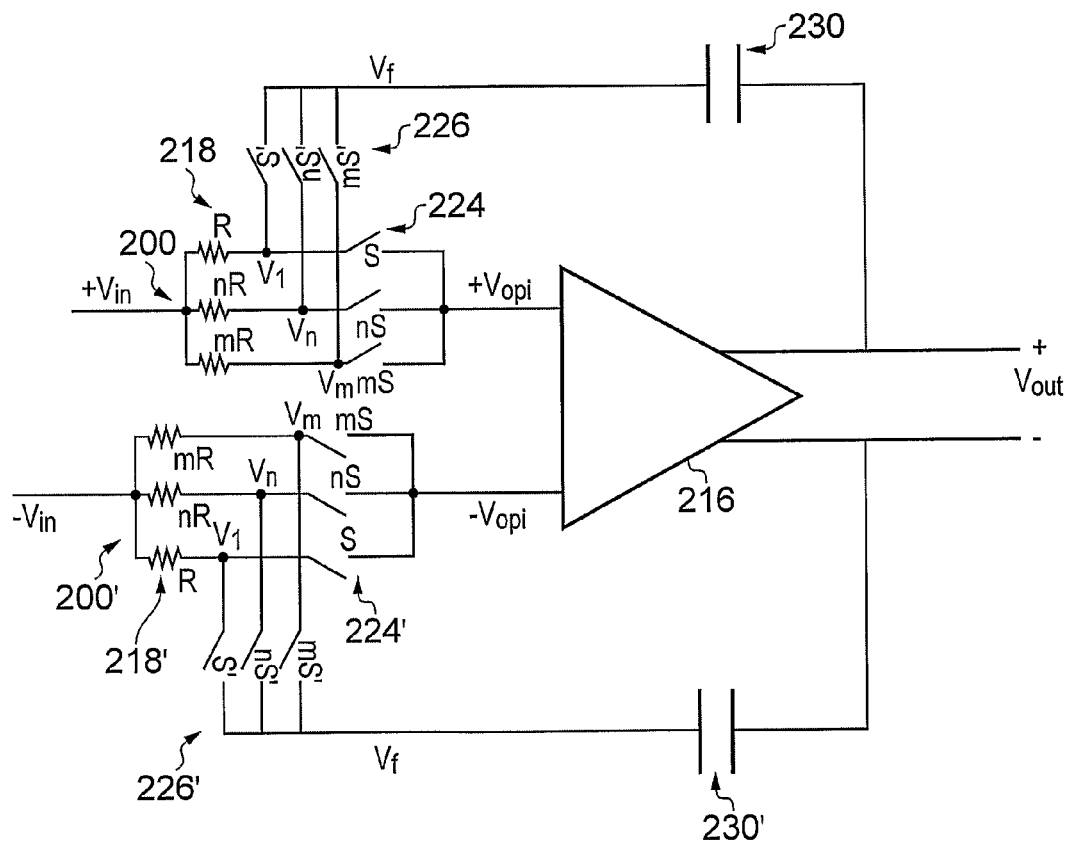
FIG. 4 shows a further embodiment of the present invention with the variable gain amplifier configured as a differential amplifier.

A further embodiment of the present invention is schematically illustrated in FIG. 4, in which the variable gain amplifier is configured as a fully differential amplifier to provide an output as a function of the difference between two input values. In this configuration each input of the integrator 216 is connected to a variable resistance input, each variable resistance input comprising a plurality of parallel input chains 200. Each input chain is arranged in an analogous fashion to the configuration shown in FIG. 3, namely a resistor 218, 218' connected in series to a first switch 224, 224', which in turn is connected to a respective one of the inputs to the integrator. At an intermediate node on each input chain a respective second switch 226, 226', the other terminal of which is connected to a respective feedback loop. In the differential configuration shown in FIG. 4 the integrator has a +ve output and a −ve output with a feedback loop connected to a respective one of the outputs. In the configuration shown each feedback loop includes a feedback capacitor 230, 230' having a first terminal connected to a respective one oldie integrator outputs and a second terminal connected to each of the second switches 226, 226' in the respective input chain. For each set of input chains connected to respective inputs of the integrator the values of the resistors R and the on-resistances of the first and second switches are scaled with respect to one another as described above in relation to FIG. 3.

The invention claimed is:

1. A variable gain amplifier comprising:
an input voltage node;
an integrator having an input, an output and a feedback loop; and
a plurality of input chains connected in parallel between the input voltage node and the input of the integrator, each input chain including a resistor and a first switch connected in series; characterised in that:
the resistor of each input chain is connected to the input voltage node; and
the integrator feedback loop includes a plurality of second switches connected in parallel, each second switch connected to an intermediate node between the resistor and first switch of a respective input chain and coupled to the output of the integrator, wherein the resistance of the resistors in the input chains is scaled by a scaling factor with respect to one another and the on-resistances of the first and second switches connected to each intermediate node are scaled by the corresponding scaling factor.

2. The variable gain amplifier of claim 1, wherein said switches comprise transistors.

3. The variable gain amplifier of claim 2, wherein the on-resistances of said transistors are scaled by scaling one or both of the width and length of the transistors.

4. The variable gain amplifier of claim 1, wherein the on-resistance of a first switch in an output chain is not equal to the on-resistance of the corresponding second switch connected to the input chain.

5. The variable gain amplifier of claim 1, wherein the scaling factor applied to the resistor and first and second switches of a first input chain with respect to a further input chain is not equal to the scaling factor applied to the resistor and first and second switch of a second input chain with respect to the further input chain.

6. The variable gain amplifier of claim 1, wherein the integrator comprises an operational amplifier.

7. An analogue-to-digital converter including a variable gain amplifier according to claim 1.

* * * * *

UNITED STATES PATENT AND TRADEMARK OFFICE
CERTIFICATE OF CORRECTION

PATENT NO.      : 8,410,846 B2
APPLICATION NO. : 13/126222
DATED           : April 2, 2013
INVENTOR(S)     : Zare-Hoseini It is certified that error appears in the above-identified patent and that said Letters Patent is hereby corrected as shown below:

In the Specifications

In Column 1, Line 16, delete "variable in" and insert -- variable gain --, therefor.

In Column 1, Line 27, delete "variable in" and insert -- variable gain --, therefor.

In Column 2, Line 42, delete "variable in" and insert -- variable gain --, therefor.

In Column 3, Line 37, delete "is no" and insert -- m --, therefor.

In Column 4, Line 41, delete "oldie" and insert -- of the --, therefor.

Signed and Sealed this
Eleventh Day of June, 2013

Teresa Stanek Rea
*Acting Director of the United States Patent and Trademark Office*